United States Patent
Yaegashi et al.

[11] Patent Number: 6,106,462
[45] Date of Patent: *Aug. 22, 2000

[54] ULTRASONIC DIAGNOSTIC APPARATUS

[75] Inventors: Mitsutoshi Yaegashi; Kazuhiro Hirota, both of Nakai-machi, Japan

[73] Assignee: Terumo Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/919,322

[22] Filed: Aug. 28, 1997

[30] Foreign Application Priority Data

Aug. 30, 1996 [JP] Japan ................................. 8-230802

[51] Int. Cl.$^7$ ................................ A61B 8/00; A61B 8/12
[52] U.S. Cl. .......................... 600/437; 600/443; 600/463
[58] Field of Search .................................. 600/437, 442, 600/447, 462–463, 433; 73/599, 626

[56] References Cited

U.S. PATENT DOCUMENTS

| | | | |
|---|---|---|---|
| 3,192,491 | 6/1965 | Hesselberth et al. | 333/17 |
| 4,442,713 | 4/1984 | Wilson et al. | 73/599 |
| 4,446,740 | 5/1984 | Wilson et al. | 600/447 X |
| 4,731,877 | 3/1988 | Moon . | |
| 4,757,715 | 7/1988 | Miwa et al. . | |
| 5,125,410 | 6/1992 | Misono et al. | 600/463 |
| 5,507,293 | 4/1996 | Tannaka et al. | 600/447 |

FOREIGN PATENT DOCUMENTS

| | | |
|---|---|---|
| 0 140 392 | 5/1985 | European Pat. Off. . |
| 0 215 137 | 3/1987 | European Pat. Off. . |

*Primary Examiner*—Francis J. Jaworski
*Attorney, Agent, or Firm*—Burns, Doane, Swecker & Mathis, LLP

[57] ABSTRACT

Disclosed is a celiac diagnostic apparatus in which the characteristics of a filter for filtering a wave reflected by a tissue inside an object are made steep, and an ultrasonic wave capable of making a high-accuracy diagnosis for the object is used. C1, C2, and C3 are constituted using variable capacitance diodes. Three LC filters, i.e., an LC filter constituted by L1 and C1, an LC filter constituted by L2 and C2, and an LC filter constituted by L3 and C3 are serially connected to constitute the filter, whose cutoff characteristics is still practical even when the cutoff frequency exceeds 20 MHz.

13 Claims, 21 Drawing Sheets

FIG. 2

| | 34MHz | 39MHz | 44MHz |
|---|---|---|---|
| L1 (μH) | 0.24 | 0.21 | 0.19 |
| L2 (μH) | 0.42 | 0.37 | 0.32 |
| L3 (μH) | 0.35 | 0.31 | 0.27 |
| C1 (pF) | 142 | 124 | 110 |
| C2 (pF) | 168 | 146 | 129 |
| C3 (pF) | 97 | 85 | 75 |

FIG. 5

|       | 30MHz | 39MHz | 48MHz |
|-------|-------|-------|-------|
| L1 (μH) | 0.28 | 0.21 | 0.17 |
| L2 (μH) | 0.48 | 0.37 | 0.30 |
| L3 (μH) | 0.40 | 0.31 | 0.25 |
| C1 (pF) | 161  | 124  | 101  |
| C2 (pF) | 190  | 146  | 119  |
| C3 (pF) | 110  | 85   | 69   |

FIG. 11

|  | V1 | V2 | V3 | V4 | V5 | V6 |
|---|---|---|---|---|---|---|
| CASE5 (30MHz) | 1 | 0.5 | 2.5 | 3 | 1 | 1 |
| CASE6 (40MHz) | 10 | 13 | 11 | 14 | 14 | 10 |

UNIT [V]

FREQUENCY CHARACTERISTICS IN CASE 5

F I G. 15
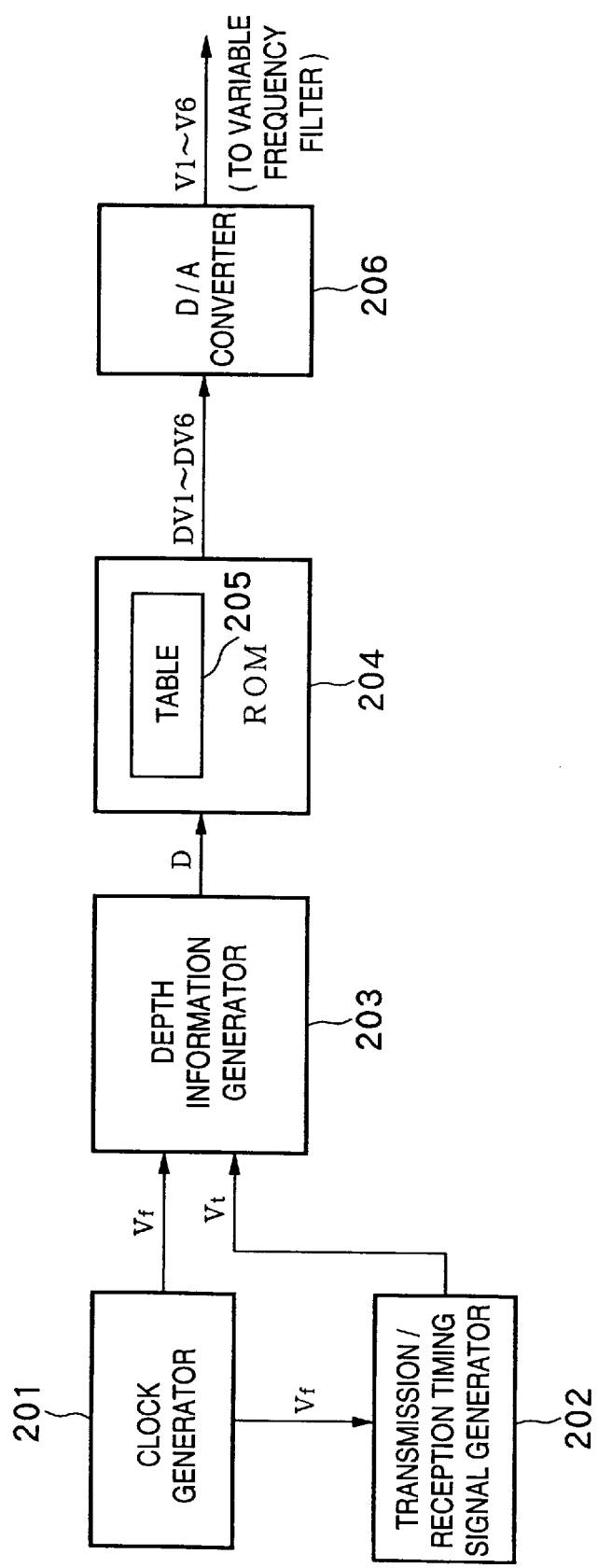

ULTRASONIC DIAGNOSTIC APPARATUS

BACKGROUND OF THE INVENTION

The present invention relates to an ultrasonic diagnostic apparatus and, more particularly, to an ultrasonic diagnostic apparatus for transmitting an ultrasonic wave to the object to make a diagnosis for the object on the basis of the reflected wave.

There is widely known a ultrasonic diagnostic apparatus for transmitting an ultrasonic wave from an ultrasonic transducer incorporated in a catheter inserted in a blood vessel or a vessel, receiving the wave reflected by the tissue inside the object by the ultrasonic transducer, performing detection, amplification, and the like for the reflected wave, and displaying an image based on the reflected wave on a display such as a CRT.

In general, an ultrasonic wave radiated inside the object is absorbed and attenuated by the tissue of the object in passing through a diagnosis region. The absorption coefficient of a living body is about 1 to 3 dB/(cm·MHz). The influence of absorption and attenuation depends on not only the propagation distance of the ultrasonic wave, but also the frequency of the ultrasonic wave. A higher-frequency ultrasonic wave attenuates more than a lower frequency ultrasonic wave.

The resolution along the propagation direction of the ultrasonic wave in the ultrasonic diagnostic apparatus becomes higher as the frequency of the ultrasonic wave becomes higher. On the other hand, as the distance from the ultrasonic transducer increases, the sensitivity decreases due to absorption and attenuation of the ultrasonic wave, resulting in an image having a low signal to noise ratio (hereinafter. referred to as "S/N ratio").

A high-frequency ultrasonic wave is therefore used for a near-distance portion from the ultrasonic transducer to obtain a high-resolution image, whereas a low-frequency ultrasonic wave is used for a far-distance portion to obtain an image in which the S/N ratio hardly decreases though the resolution is low. According to this method, a wave reflected by the tissue inside the object is received by an ultrasonic transducer, and the characteristics of a filter for filtering the reflected wave are changed in accordance with the distance from the ultrasonic transducer (observation depth).

As this filter, a bandpass filter (BPF) obtained by combining a low-pass filter (LPF) and a high-pass filter (HPF) is generally used. The low-pass filter decreases the cutoff frequency as the observation depth increases, thereby realizing a high resolution in a region where the observation depth is small, and preventing a decrease in S/N ratio in a region where the observation depth is large. The high-pass filter decreases the cutoff frequency as the observation depth increases. By virtue of these characteristics on a LPF and a HPF, the bandpass filter suppresses the thermal noise to a predetermined value or less, while it makes the bandwidth constant.

In an electrically scanned ultrasonic diagnostic apparatus, the use frequency is about 3.5 to 10 MHz. To realize a filter having characteristics variable in accordance with the observation depth at these frequencies, the low-pass filter and the high-pass filter are constituted by one RC or LC circuit, and a variable capacitance diode is employed as a capacitor (C).

As the use frequency exceeds 20 MHz like a celiac ultrasonic diagnostic apparatus for representing a blood vessel and a vessel as an image, the band broadens, thus resulting in increasing received thermal noise. This is because the RMS (Root Mean Square) value of the thermal noise is proportional to the square root of the bandwidth.

In the above-described filter having a variable cutoff frequency, the frequency cutoff characteristics must be made steep to eliminate the influence of redundant thermal noise. However, in the above-described filter constituted by one RC or LC circuit, the frequency cutoff characteristics are poor, and a practical diagnosis image cannot be obtained.

SUMMARY OF THE INVENTION

Accordingly, it is an object of the present invention to provide an ultrasonic diagnostic apparatus capable of making a high-accuracy diagnosis for the object, and obtaining a high-quality diagnosis image.

According to one aspect of the present invention, the foregoing object is attained by providing an ultrasonic diagnostic apparatus for transmitting an ultrasonic wave to an object to make a diagnosis for the object on the basis of a reflected wave on the transmitted wave, comprising reception means for receiving the reflected wave by the object and converting the reflected wave into an electrical signal, filter means for filtering the electrical signal, and control means for controlling a filter characteristic of the filter means, wherein the filter means is constituted by connecting at least two LC filters, each including a variable capacitance diode, and the control means adjusts a capacitance of the variable capacitance diode in accordance with an observation depth so as to control the filter characteristic of the filter means.

In accordance with the above-described apparatus according to the present invention, a high-accuracy diagnosis is made for the object by constituting a multistage filter means.

It is preferable in the above-mentioned ultrasonic diagnostic apparatus that the control means decreases a cutoff frequency of a high-frequency side in the filter means as the observation depth increases.

It is preferable in the above-mentioned ultrasonic diagnostic apparatus that the control means decrease a cutoff frequency of a high-frequency side in the filter means on the basis of an elapsed time from a start of transmitting the ultrasonic wave to the object.

It is preferable in the above-mentioned ultrasonic diagnostic apparatus that a cutoff frequency of a high-frequency side in the filter means be variable within a range of 20 MHz or more, and a flat characteristic of a passband falls within 0.1 dB.

It is preferable in the above-mentioned ultrasonic diagnostic apparatus that, in a circuit element constituting the filter means, values of capacitors including the variable capacitance diodes be optimized around a lower limit, an upper limit, and a median within a variable range of a cutoff frequency of the filter means, and a value of an inductor is optimized around the median.

It is preferable in the above-mentioned ultrasonic diagnostic apparatus that the filter means be a bandpass filter.

According to another aspect of the present invention, the foregoing object is attained by providing an ultrasonic diagnostic apparatus for transmitting an ultrasonic wave to an object to make a diagnosis for the object on the basis of a reflected wave on the transmitted wave, comprising catheter incorporating transmitting means for generating an ultrasonic wave and transmitting the ultrasonic wave to the object, reception means for receiving the reflected wave by the object and converting the reflected wave into an electrical signal, filter means for filtering the electrical signal, and control means for controlling a filter characteristic of the filter means, wherein the control means keeps the filter characteristic almost constant inside a body cavity where the catheter is inserted, while changes the filter characteristic in accordance with an observation depth from a portion near a wall tissue of the body cavity outside the body cavity.

In accordance with the above-described apparatus according to the present invention, a high-quality diagnosis can be made for the object by suppressing an unwanted deterioration in resolution.

It is preferable in the above-mentioned ultrasonic diagnostic apparatus that, as the observation depth from the portion near the wall tissue of the body cavity increases, the control means decrease a cutoff frequency of a high-frequency side in the filter means outside the body cavity to which the catheter is inserted.

It is preferable in the above-mentioned ultrasonic diagnostic apparatus that, on the basis of reception of a reflected wave, exceeding a predetermined level, of waves reflected by the object, the control means decrease a cutoff frequency of a high-frequency side in the filter means after the reception of the reflected wave as the observation depth from the tissue inside the object associated with the reflected wave increases.

It is preferable in the above-mentioned ultrasonic diagnostic apparatus that the control means decreases a cutoff frequency of a high-frequency side in the filter means in accordance with an elapsed time from reception of a reflected wave, exceeding a predetermined level, of waves reflected by the object.

It is preferable in the above-mentioned ultrasonic diagnostic apparatus that the filter means be constituted by an LC filter including a variable capacitance diode, and the control means adjusts a capacitance of the variable capacitance diode so as to change the filter characteristic.

It is preferable in the above-mentioned ultrasonic diagnostic apparatus that the filter means be constituted by connecting at least two LC filters, each including a variable capacitance diode, and the control means adjusts a capacitance of the variable capacitance diode so as to change the filter characteristic.

It is preferable in the above-mentioned ultrasonic diagnostic apparatus that a cutoff frequency of a high-frequency side in the filter means is variable within a range of 20 MHz or more, and a flat characteristic of a passband falls within 0.1 dB.

It is preferable that each of the two above-mentioned ultrasonic diagnostic apparatuses further comprise imaging means for generating image information on the basis of the electrical signal filtered by the filter means.

The invention is particularly advantageous since a high-accuracy diagnosis can be made for the object.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 2 is a table showing circuit constants when the cutoff frequency ($f_c$) is changed within the range of 34 to 44 MHz;

FIG. 5 is a table showing circuit constants when the cutoff frequency ($f_c$) is changed within the range of 30 to 48 MHz;

FIG. 11 is a table showing the voltage values of control signals V1 to V6 in CASE 5 and CASE 6;

FIG. 15 is a block diagram showing an example of the arrangement of a controller;

DETAILED DESCRIPTION OF THE PREFERRED EMBODIMENTS

Preferred embodiments of the present invention will now be described in detail in accordance with the accompanying drawings.

The arrangement of a variable frequency filter used in a ultrasonic diagnostic apparatus according to this embodiment will be described. The variable frequency filter according to this embodiment is constituted by a bandpass filter obtained by combining low-pass and high-pass filters. Multistage (two-stage or more) low-pass and high-pass filters are employed to make the cutoff characteristics steep.

<Example of Arrangement of Low-Pass Filter>

Figure 1A:
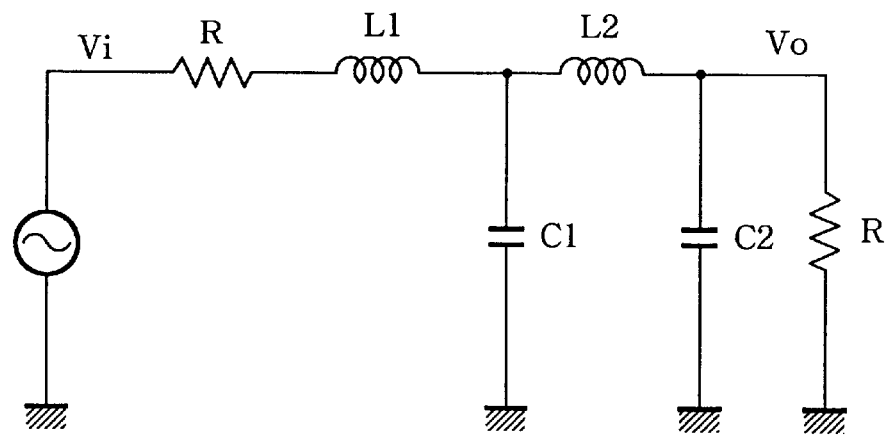
FIGS. 1A and 1B are circuit diagrams, respectively showing the configurations of Chebyshev type low-pass filters.
Figure 1B:
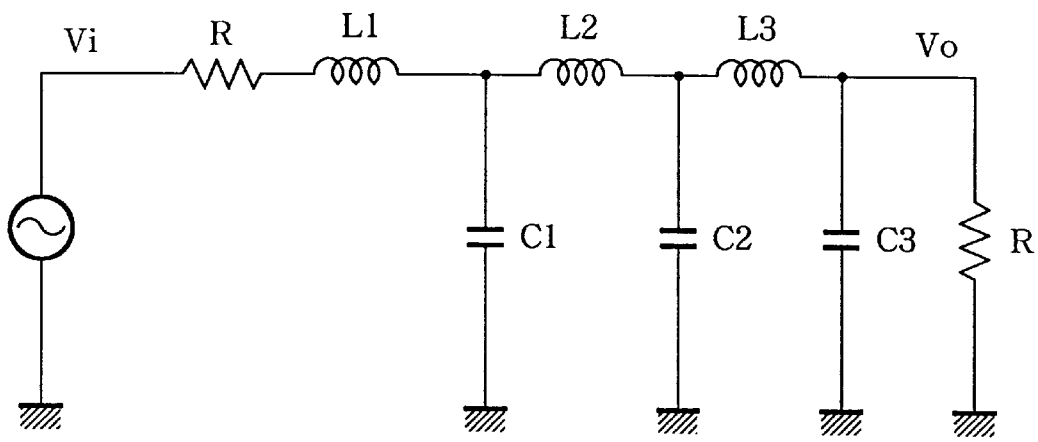

An example of constituting a low-pass filter by an LC filter using an inductor (L) and a capacitor (C) will be described. FIG. 1A shows a Chebyshev type two-stage low-pass filter using L and C, and FIG. 1B shows a Chebyshev type three-stage low-pass filter using L and C.

Next, a method of determining a circuit constant will be described below on condition that the flat characteristics of the pass band falls within 0.1 dB, where R represents the characteristic impedance, and $f_c$ represents the cutoff frequency.

(1) Two-Stage Low-Pass Filter

When design parameters g1, g2, g3, and g4 are:

g1=0.92972;

g2=1.43464;

g3=1.43464; and g4=0.92972, circuit constants L1, C1, L2, and C2 of the low-pass filter shown in FIG. 1A are given by:

$$L1=g1 \cdot R/(2\pi f_c);$$

$$C1=g2/(2\pi f_c \cdot R);$$

$$L2=g3 \cdot R/(2\pi f_c); \text{ and}$$

$$C2=g4/(2\pi f_c \cdot R).$$

(2) Three-Stage Low-Pass Filter

When design parameters g1, g2, g3, g4, g5, and g6 are:

g1=1.03822;

g2=1.51632;

g3=1.78916;

g4=1.78916;

g5=1.51632; and g6=1.03822, circuit constants L1, C1, L2, C2, L3, and C3 of the low-pass filter shown in FIG. 1B are given by:

$$L1=g1 \cdot R/(2\pi f_c);$$

$$C1=g2/(2\pi f_c \cdot R);$$

$$L2=g3 \cdot R/(2\pi f_c);$$

$$C2=g4/(2\pi f_c \cdot R);$$

$$L3=g5 \cdot R/(2\pi f_c); \text{ and}$$

$$C3=g6/(2\pi f_c \cdot R).$$

(3) N-Stage Low-Pass Filter

When design parameters gi (i=1, 2, . . . , 2N) are determined to satisfy the above condition (the flat characteristics of the passband falls within 0.1 dB), $$LN=g_{2N-1} \cdot R/(2\pi f_c), \text{ and}$$

$$CN=g_{2N}/(2\pi f_c \cdot R).$$

From the above equations, if the characteristic impedance (R) is set small, L increases, and C decreases; if the characteristic impedance (R) is set large, L decreases, and C increases.

In order to vary the cutoff frequency ($f_c$) it is desirable that both L and C are variable. Practically, only the circuit constant of C can be continuously changed, and that of L must be fixed. There is a method of switching the value of L to several stages by using an analog switch. In applying this method to the celiac ultrasonic diagnostic apparatus, however, the influence of the stray capacitance is large due to a high-frequency signal, the circuit configuration becomes complicated, and desired performance is difficult to obtain.

Even if only C is variable, such a low-pass filter can be satisfactorily applied to the celiac ultrasonic diagnostic apparatus. An example of design of the circuit constant in the three-stage low-pass filter (see FIG. 1B) will be explained below.

Assuming that the low-pass filter is applied to the celiac ultrasonic diagnostic apparatus, this low-pass filter is utilized such that a 40-MHz signal mainly passes through for a small observation depth, while a 30-MHz signal passes through for a large observation depth.

When the cutoff frequency ($f_c$) is changed within the range of 34 to 44 MHz, L1, L2, L3, C1, C2, and C3 must be strictly changed as shown in FIG. 2. Since L is difficult to change, as described above, the values of L1, L2, and L3 are fixed to values at the center frequency (39 MHz) of the cutoff frequency ($f_c$).

Under these conditions, the values of L1, L2, L3, C1, C2, and C3 must be at:

L1=0.21 $\mu$H;

L2=0.37 $\mu$H;

L3=0.31 $\mu$H;

C1=110 to 142 pF;

C2=129 to 168 pF; and

C3=75 to 97 pF.

In combinations of these circuit constants, the cutoff frequency ($f_c$) is minimized when C1=142 pF, C2=168 pF, and C3=97 pF. This combination is defined as CASE 1. The cutoff frequency ($f_c$) is maximized when C1=110 pF, C2=129 pF, and C3=75 pF. This combination is defined as CASE 2.

Figure 3:
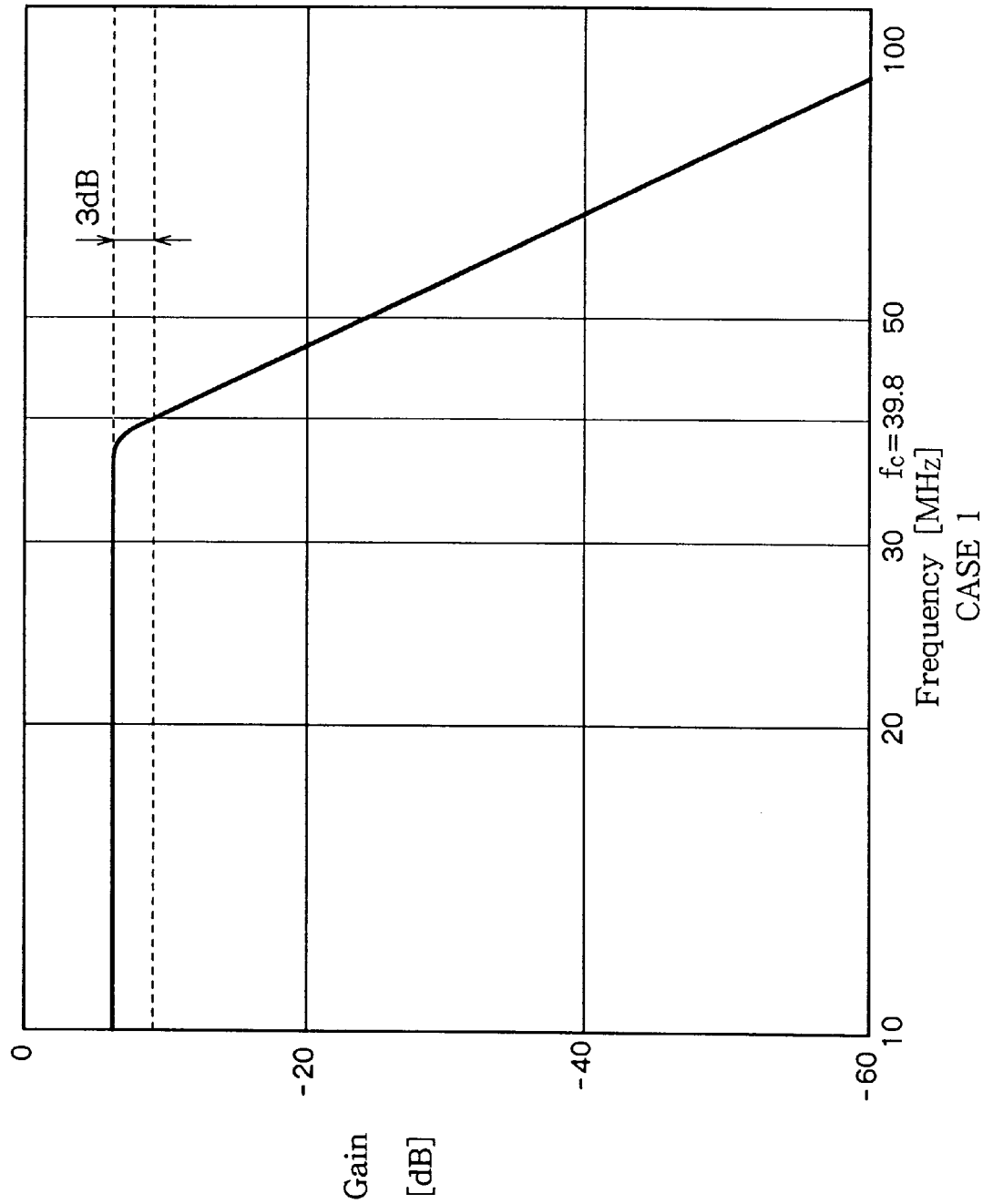
FIG. 3 is a graph showing the frequency characteristics of the low-pass filter in CASE 1.
Figure 4:
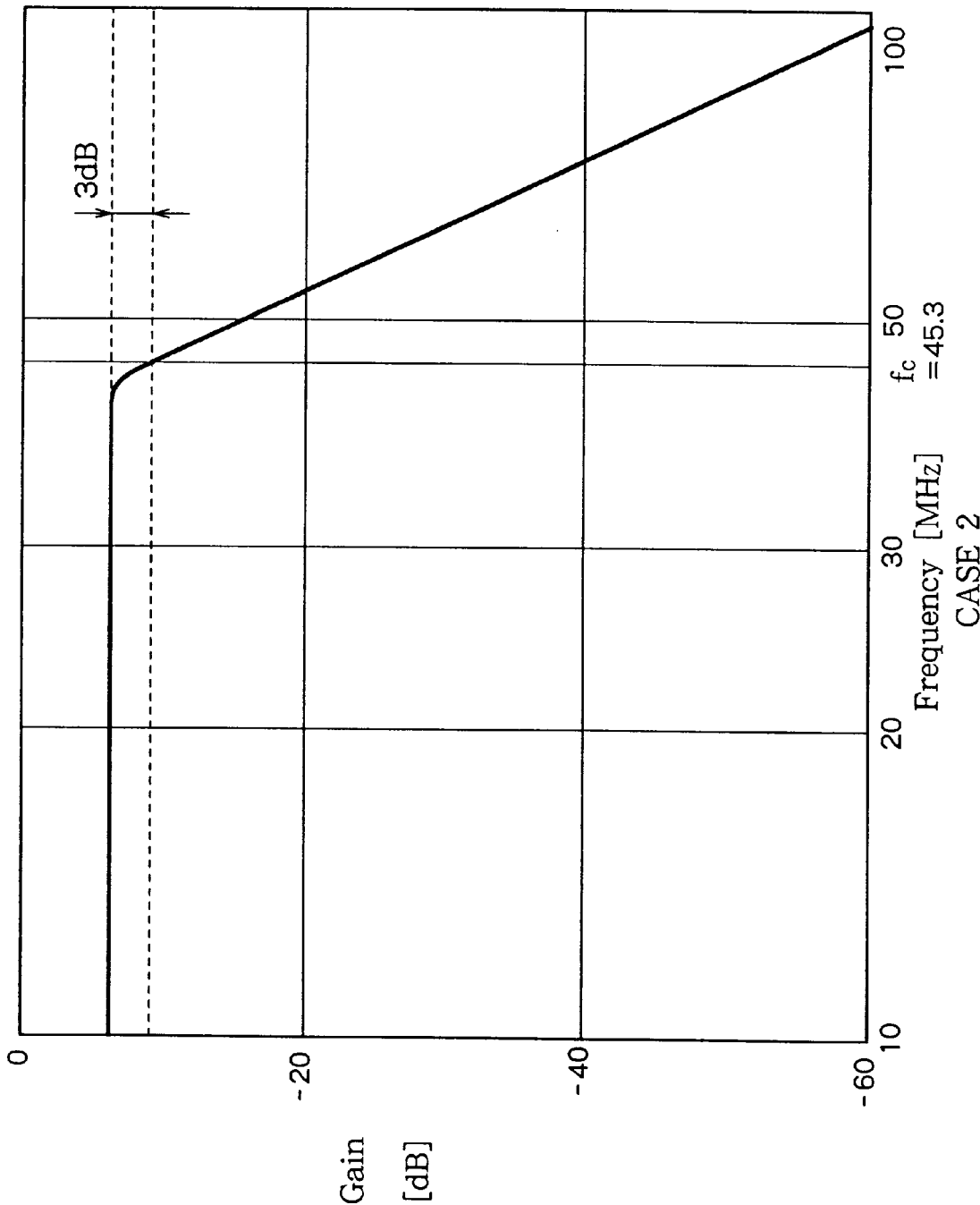
FIG. 4 is a graph showing the frequency characteristics of the low-pass filter in CASE 2.

FIGS. 3 and 4 respectively show the frequency characteristics of the low-pass filter in CASE 1 and CASE 2. Referring to FIGS. 3 and 4, the cutoff frequency ($f_c$) is 39.8 MHz in CASE 1, and 45.3 MHz in CASE 2. That is, the cutoff frequency changes within the range of 39.8 to 45.3 MHz, which is shifted from the cutoff frequency variable range of 34 to 44 MHz as the design target.

Considering this shift from the design target of the cutoff frequency ($f_c$) and variations in circuit constant, the values of L1, L2, L3, C1, C2, and C3 when the cutoff frequency ($f_c$) is changed within the range of 30 to 48 MHz are calculated, and the values of L1, L2, and L3 are fixed to values at the center frequency (39 MHz).

FIG. 5 is a table showing the values of L1, L2, L3, C1, C2, and C3 when the cutoff frequency ($f_c$) is changed within the range of 30 to 48 MHz. On the basis of FIG. 5, the values of L1, L2, L3, C1, C2, and C3 are determined in the above-described manner to obtain:

L1=0.22 $\mu$H;

L2=0.39 $\mu$H;

L3=0.33 $\mu$H;

C1=101 to 161 pF;

C2=119 to 190 pF; and

C3=69 to 110 pF.

Note that, as the value L, a value close to a value shown in FIG. 5 from the practically selectable E24 series is selected.

In combinations of these circuit constants, the cutoff frequency ($f_c$) is minimized when C1=161 pF, C2=190 pF, and C3=110 pF. This combination is defined as CASE 3. The cutoff frequency ($f_c$) is maximized when C1=101 pF, C2=119 pF, and C3=69 pF. This combination is defined as CASE 4.

Figure 6:
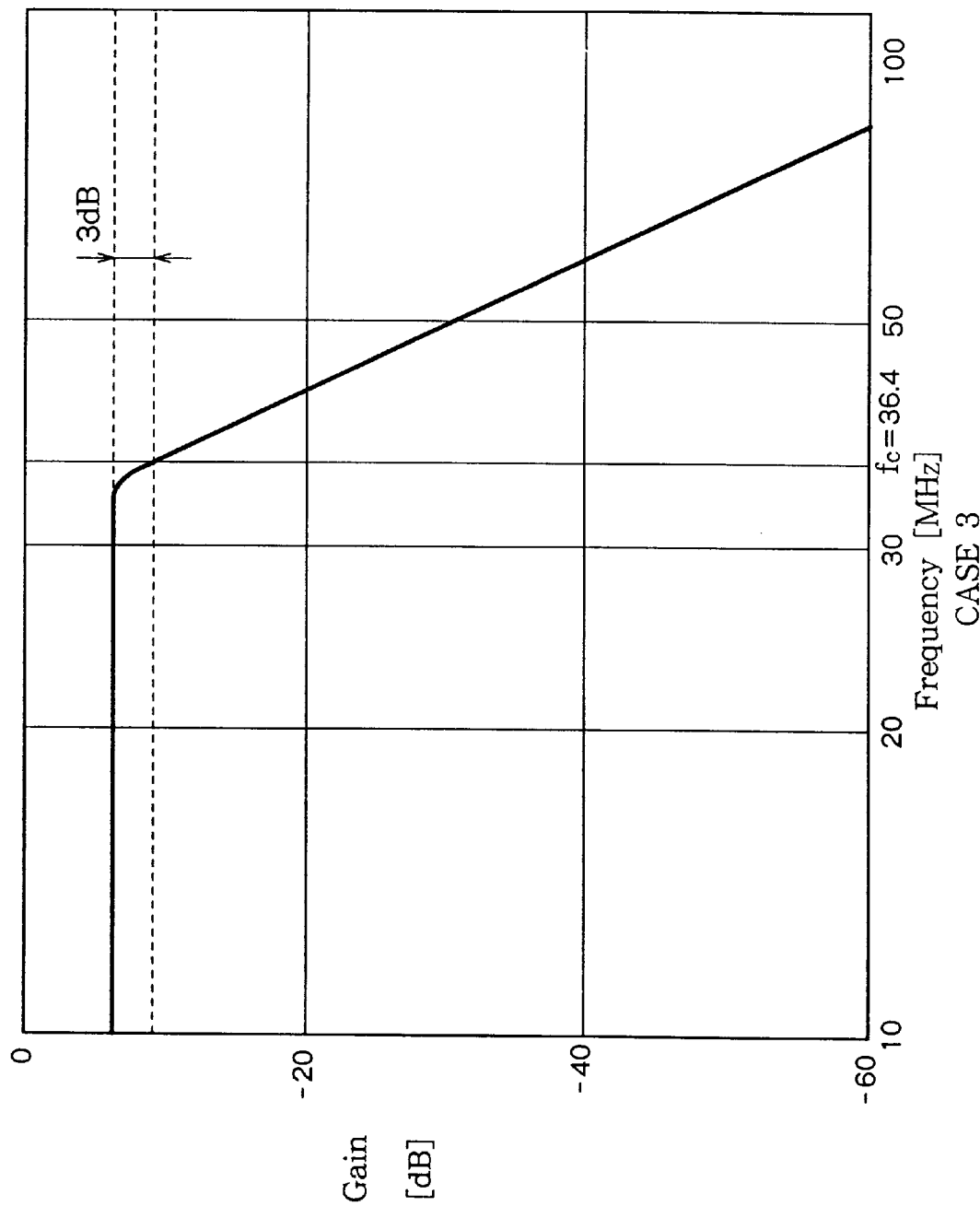
FIG. 6 is a graph showing the frequency characteristics of the low-pass filter in CASE 3.
Figure 7:
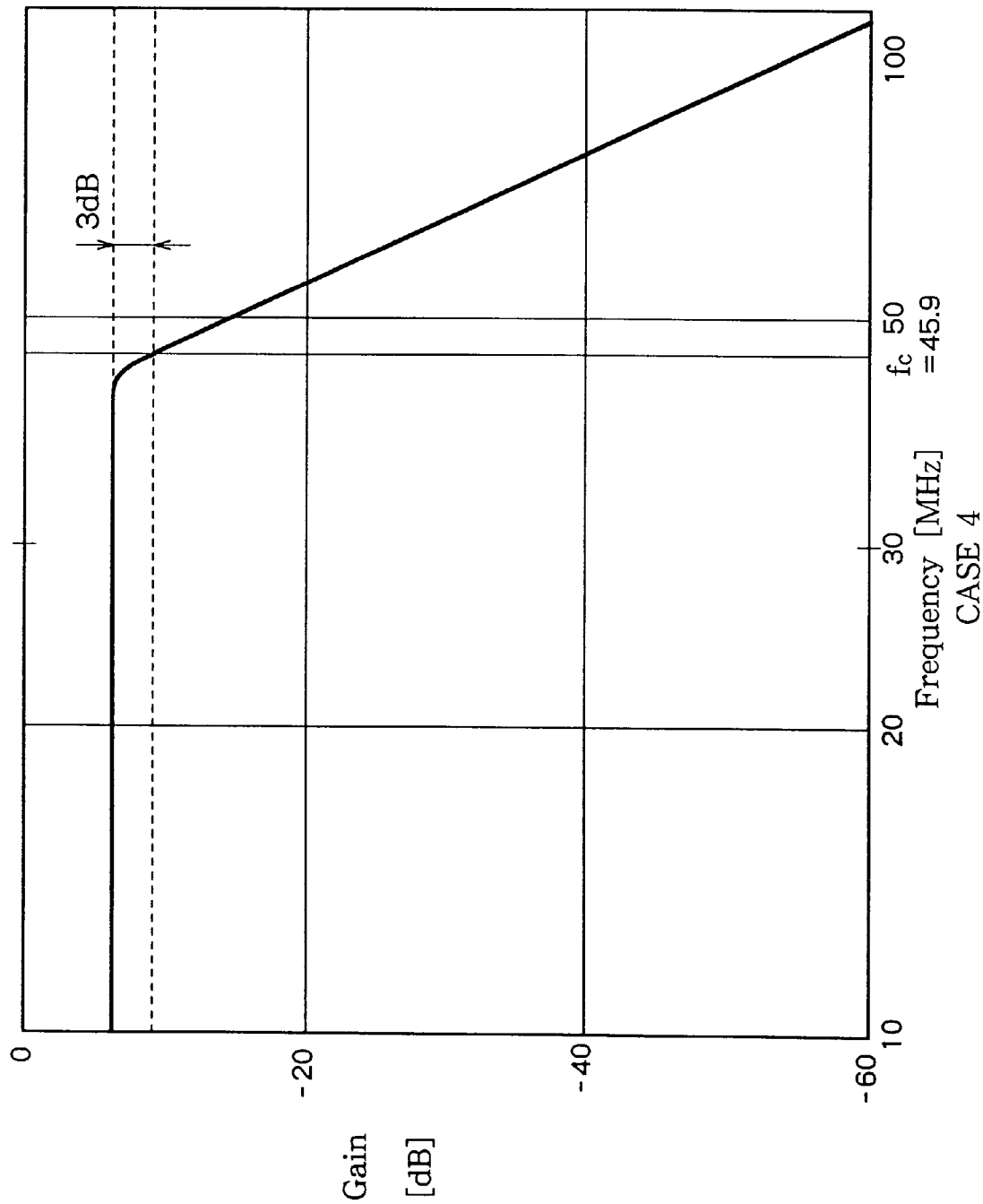
FIG. 7 is a graph showing the frequency characteristics of the low-pass filter in CASE 4.

FIGS. 6 and 7 respectively show the frequency characteristics of the low-pass filter in CASE 3 and CASE 4. Referring to FIGS. 6 and 7, the cutoff frequency ($f_c$) is 36.4

MHz in CASE 3, and 45.9 MHz in CASE 4. That is, the cutoff frequency ($f_c$) changes within the range of 36.4 to 45.9 MHz. This range has an error 10% or less compared to the range of 34 to 44 MHz as the design target, and is acceptable.

Figure 8:
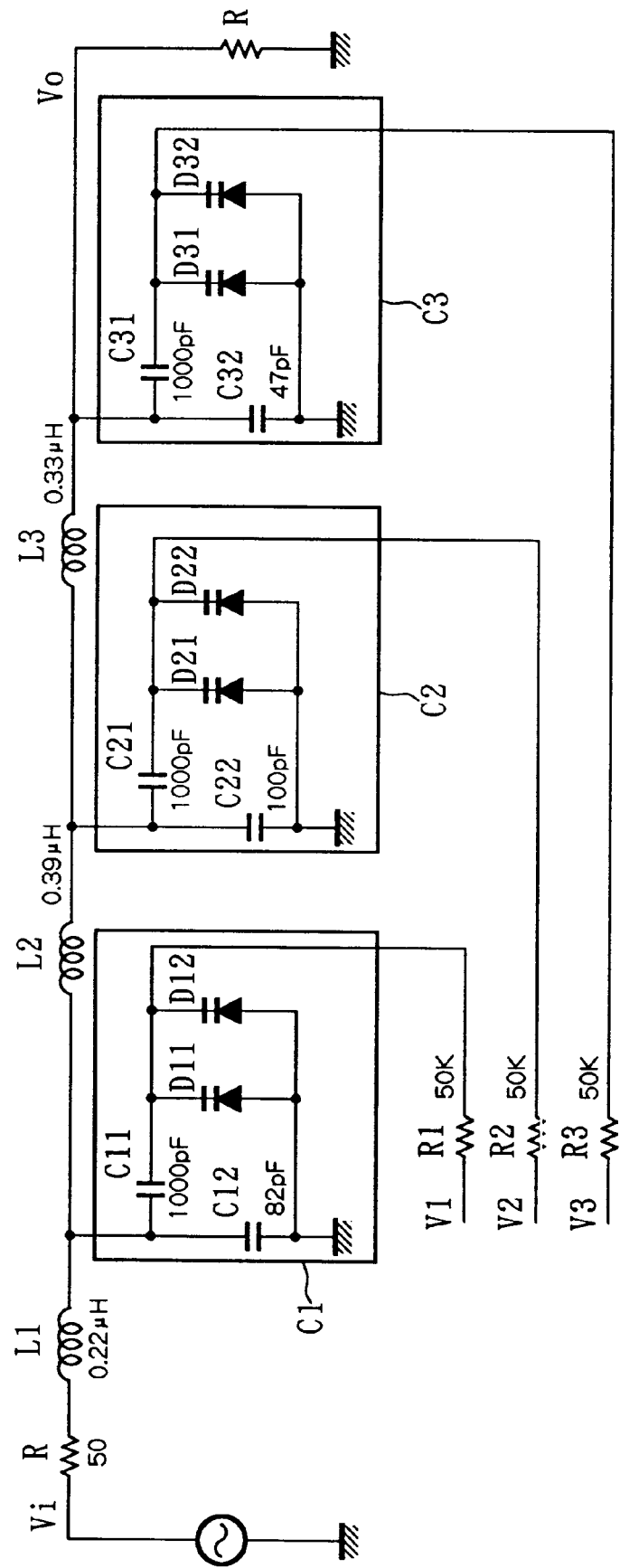
FIG. 8 is a circuit diagram showing a detailed example of the low-pass filter constituted using variable capacitance diodes.

FIG. 8 is a circuit diagram showing a detailed example of the low-pass filter constituted using variable capacitance diodes, based on the above study. In the circuit of FIG. 8, C1 is constituted by C11, C12, D11, and D12; C2, by C21, C22, D21, and D22; and C3, by C31, C32, D31, and D32.

Reference symbols D11, D12, D21, D22, D31, and D32 denote variable capacitance diodes. Considering the frequency of an input signal (signal obtained by converting an ultrasonic signal into an electrical signal), an FM purpose variable capacitance diode is preferable. In general, the capacitance of the FM purpose variable capacitance diode changes within the range of 9 to 40 pF for an inverse voltage of 1 to 14 V. In the example shown in FIG. 8, two variable capacitance diodes are parallel-connected to each capacitor because the range of changing the values of C1, C2, and C3 is wide.

The variable capacitance diodes D11 and D12 constituting C1 are controlled by the voltage of a control signal V1, the variable capacitance diodes D21 and D22 constituting C2 are controlled by the voltage of a control signal V2, and the variable capacitance diodes D31 and D32 constituting C3 are controlled by the voltage of a control signal V3.

Reference symbols R1, R2, and R3 denote protection resistors used for applying an inverse bias to the variable capacitance diodes in C1, C2, and C3; and C11, C21, and C31, capacitors for cutting off a DC component.

<Example of Arrangement of High-Pass Filter>

Figure 9A:
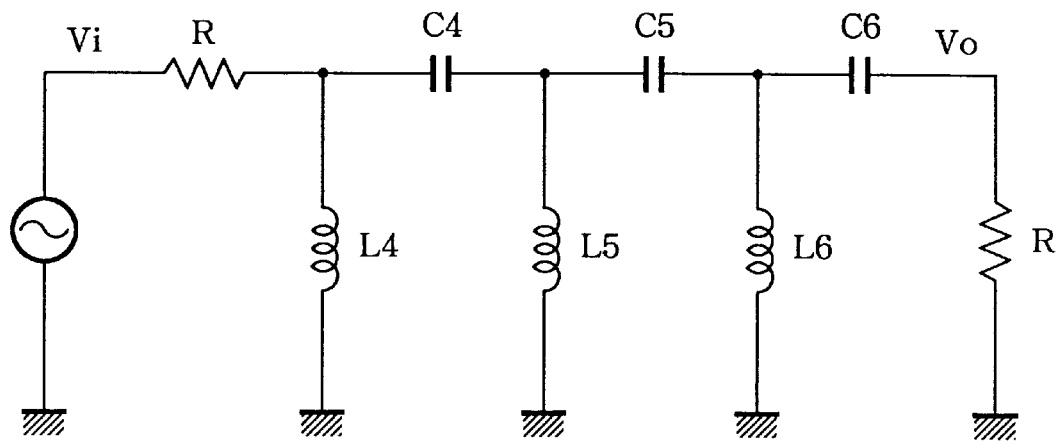
FIGS. 9A and 9B are circuit diagrams, respectively, showing examples of the arrangement of a high-pass filter.
Figure 9B:
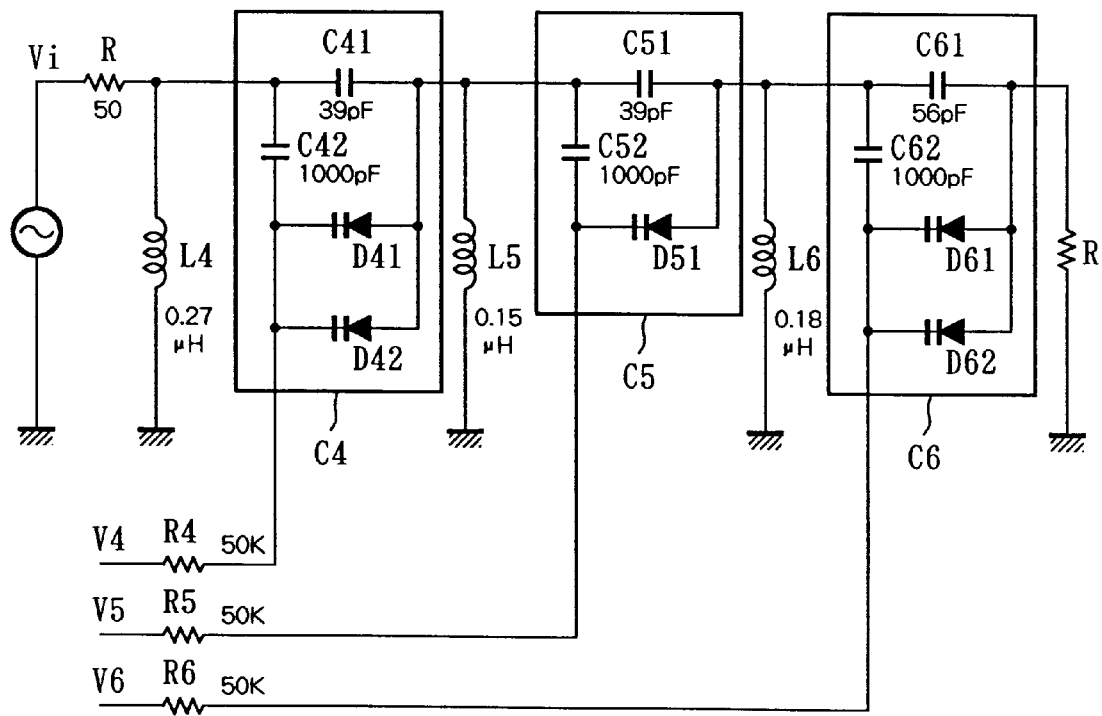

FIGS. 9A and 9B show an example of the arrangement of a high-pass filter designed based on the same concept as design of the low-pass filter.

As shown in FIG. 9A, the high-pass filter is obtained by arranging L and C reverse to those in the low-pass filter. FIG. 9B shows an example of constituting the high-pass filter shown in FIG. 9A by using variable capacitance diodes.

C4 is constituted by C41, C42, D41, and D42; C5, by C51, C52, and D51; and C6, by C61, C62, D61, and D62.

Reference symbols D41, D42, D51, D61, and D62 denote variable capacitance diodes. The variable capacitance diodes D41 and D42 constituting C4 are controlled by the voltage of a control signal V4, the variable capacitance diode D51 constituting C5 is controlled by the voltage of a control signal V5, and the variable capacitance diodes D61 and D62 constituting C6 are controlled by the voltage of a control signal V6.

Reference symbols C42, C52, and C62 denote capacitors for cutting off a DC component.

<Example of Arrangement of Bandpass Filter>

Figure 10:
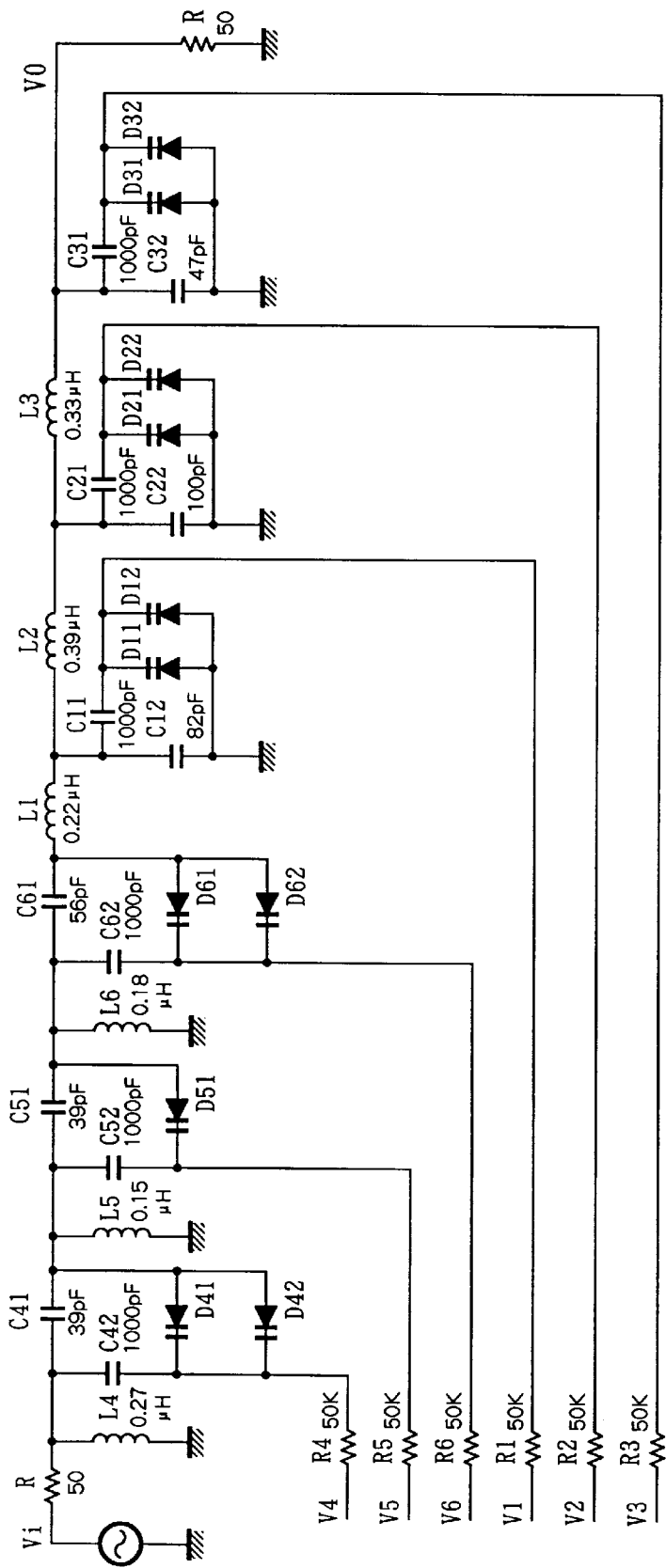
FIG. 10 is a circuit diagram showing an example of the arrangement of a bandpass filter obtained by combining the low-pass and high-pass filters.

FIG. 10 is a circuit diagram showing an example of the arrangement of a bandpass filter obtained by combining the above-described low-pass and high-pass filters.

In the bandpass filter, a case where the center frequency of the band is 30 MHz is defined as CASE 5, and a case where the center frequency of the band is 40 MHz is defined as CASE 6. FIG. 11 is a table showing the voltage values of the control signals V1 to V6 in CASE 5 and CASE 6.

Figure 12:
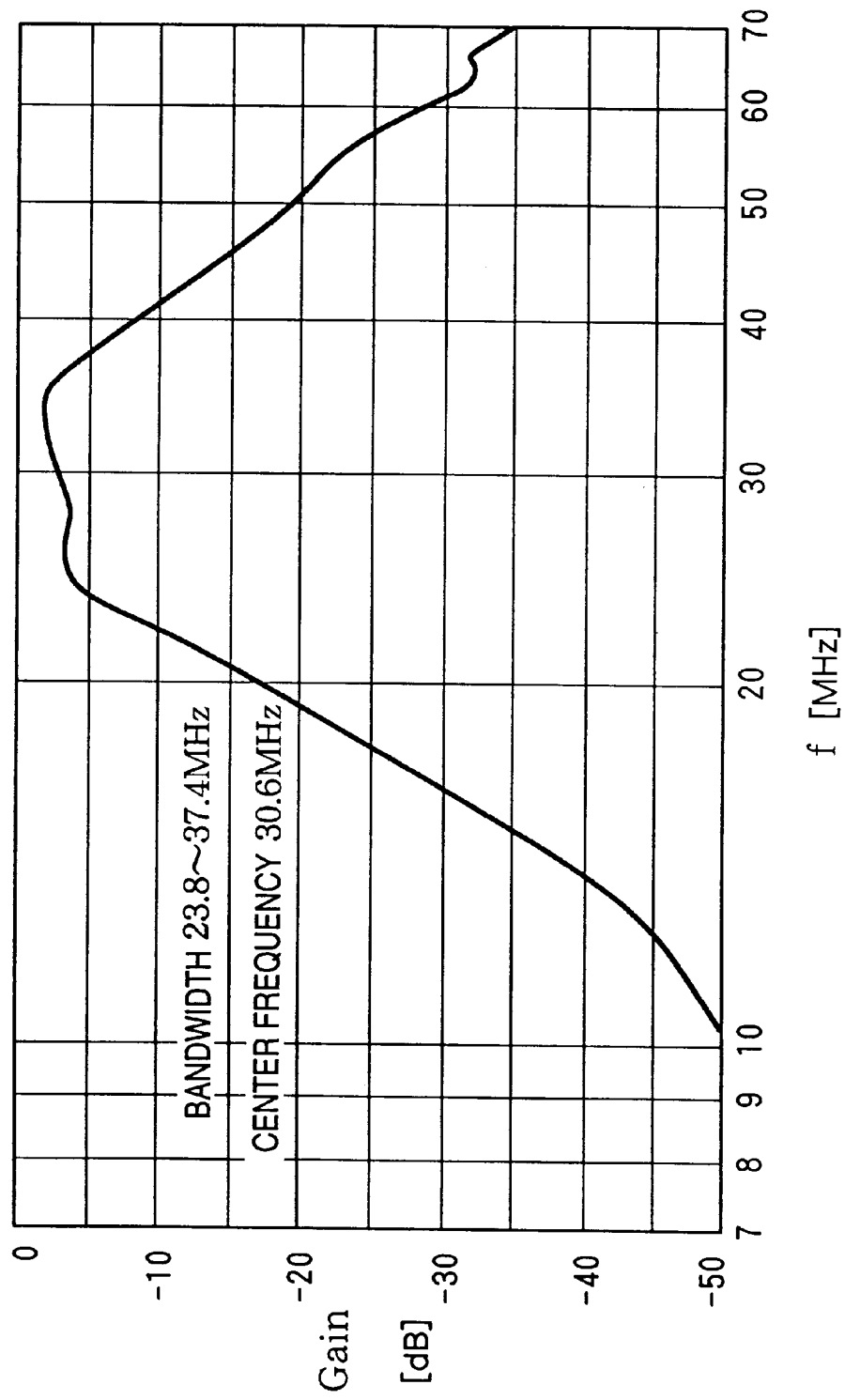
FIG. 12 is a graph showing the frequency characteristics of the bandpass filter in CASE 5.
Figure 13:
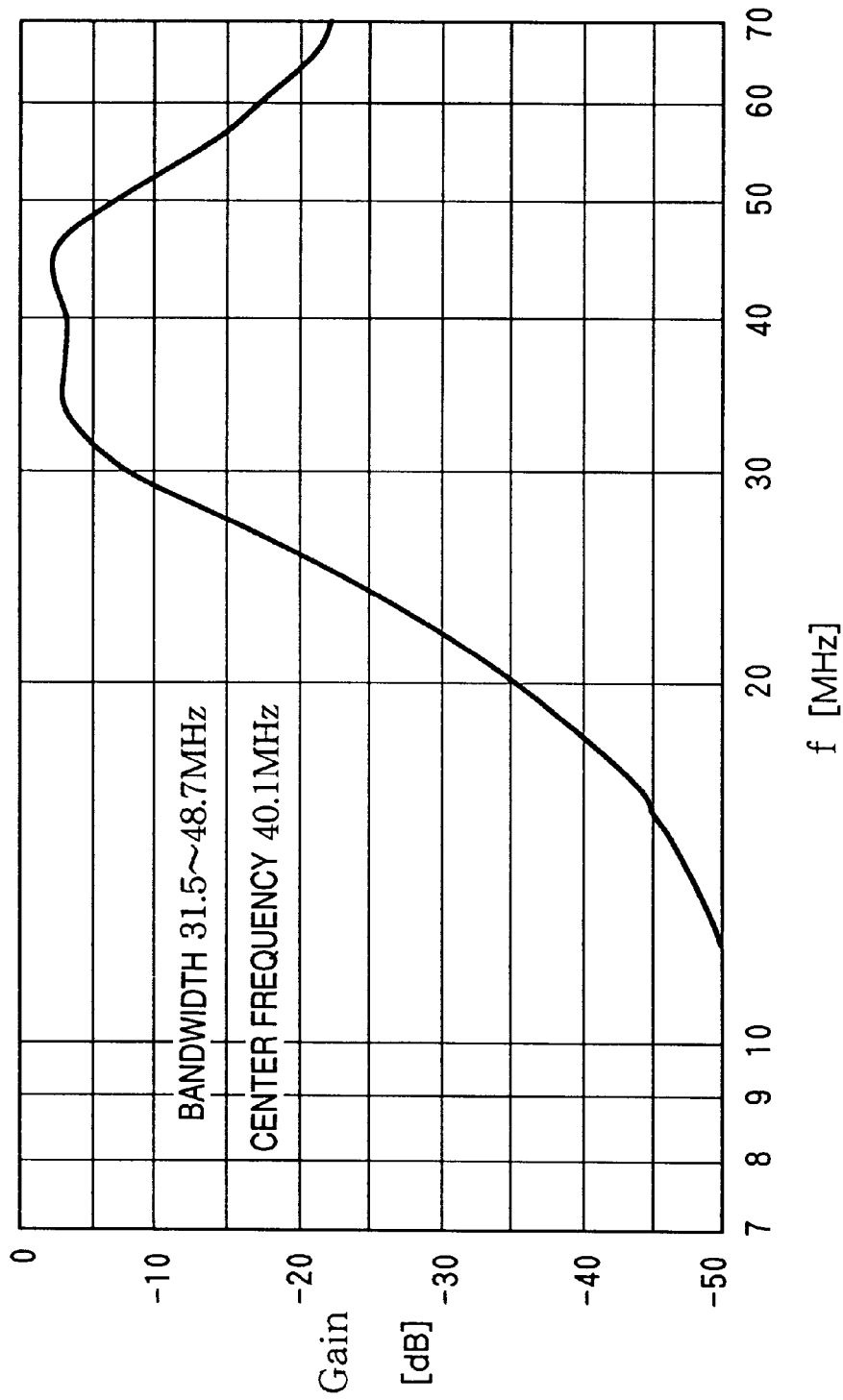
FIG. 13 is a graph showing the frequency characteristics of the bandpass filter in CASE 6.

FIG. 12 is a graph showing the frequency characteristics of the bandpass filter in CASE 5, and FIG. 13 is a graph showing the frequency characteristics of the bandpass filter in CASE 6. From FIGS. 12 and 13, a practical filter, i.e., a filter having steep (good) cutoff characteristics can be obtained at a frequency higher than 20 MHz. In CASE 5, the bandpass range (−3 dB) is 23.8 to 37.4 MHz, and the center frequency (center of the band) is 30.6 MHz. In CASE 6, the bandpass range is 31.5 to 48.7 MHz, and the center frequency is 40.1 MHz. These results show that a bandpass filter having practical frequency characteristics can be obtained even when the cutoff frequency exceeds 20 MHz.

As described above, 1) the range of the cutoff frequency to be changed is determined, 2) circuit constants at the lower limit value, upper limit value, and median value (e.g., mean value of the upper and lower limit values) of the range are calculated, 3) a variable capacitance diode which satisfies the calculated circuit constants is employed for the value of C, and 4) the circuit constant at the median value is employed for the value of L to constitute a multistage filter. As a result, a filter having good cutoff characteristics and a variable cutoff frequency can be obtained.

If a variable capacitance diode is employed as C in the LC filter, and constituted such that its capacitance can be controlled, the characteristics (passband) of the LC filter can be adjusted continuously or discretely by controlling the voltage.

Although the above description is associated with the Chebyshev type filter, the above approach is applicable to another characteristic filter such as a Bessel type filter.

If the above bandpass filter is applied to the ultrasonic diagnostic apparatus, a high-resolution image can be obtained by increasing the cutoff frequency of the high-frequency side (low-pass filter) in a region where a observation depth is small, and an image in which the S/N ratio hardly decreases can be obtained by decreasing the cutoff frequency of the high-frequency side (low-pass filter) in a region where the observation depth is large.

<Example of Arrangement of Celiac Ultrasonic Diagnostic Apparatus>

Figure 14:
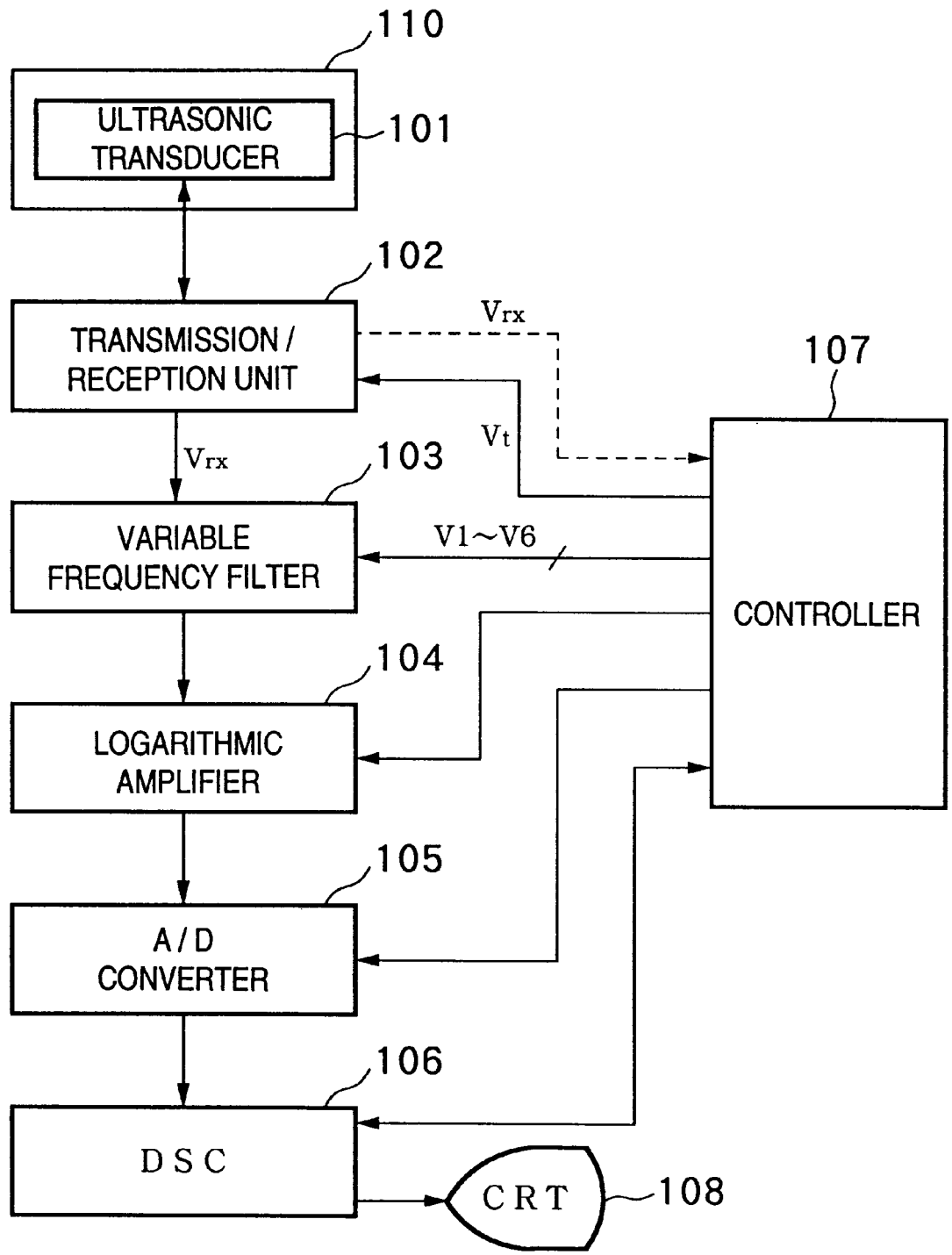
FIG. 14 is a block diagram showing an example of the arrangement of a celiac ultrasonic diagnostic apparatus using the bandpass filter.

FIG. 14 is a block diagram showing an example of the arrangement of a ultrasonic diagnostic apparatus using the above bandpass filter. An ultrasonic transducer 101 incorporated in a catheter 110 is driven by a transmission/reception unit 102 to generate and transmit an ultrasonic wave, receives the wave reflected inside the object, and converts the reflected wave into an electrical signal to output the signal as a detection signal to the transmission/reception unit 102. The transmission/reception unit 102 amplifies the detection signal supplied from the ultrasonic transducer 101 to supply the amplified signal as a reception signal Vrx to a variable frequency filter 103.

The variable frequency filter 103 is a filter having frequency characteristics (cutoff frequency) changeable in accordance with the control of a controller 107, i.e., the observation depth. The variable frequency filter 103 is constituted by the above bandpass filter. More specifically, in the variable frequency filter 103, the capacitances of the variable capacitance diodes are controlled on the basis of control signals V1 to V6 supplied from the controller 107, thereby controlling the frequency characteristics (cutoff frequency).

The electrical signal passing through the variable frequency filter 103 is logarithmically amplified by a logarithmic amplifier 104, A/D-converted by an A/D converter 105, and then input to a DSC (Digital Scan Converter) 106. With this processing, an ultrasonic tomogram is displayed on a CRT 108 as a display in real time.

The controller 107 supervisorily controls the transmission/reception unit 102, the variable frequency filter 103, the logarithmic amplifier 104, the A/D converter 105, and the DSC 106.

Figure 16:
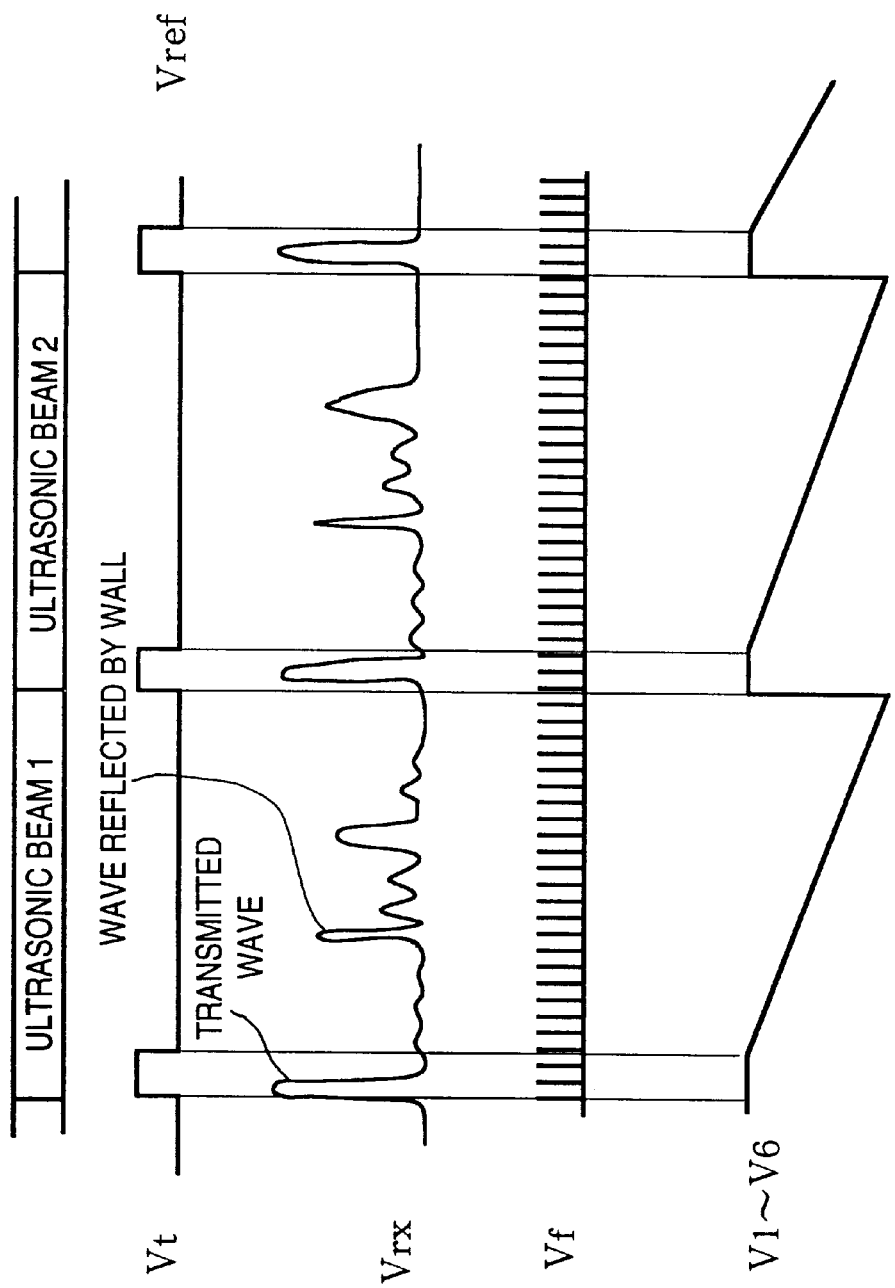
FIG. 16 is a waveform chart showing typical signal waveforms in the controller.

FIG. 15 is a block diagram showing an example of the arrangement of the controller 107. FIG. 16 is a waveform chart showing typical signal waveforms in the controller 107. A clock generator 201 generates a clock signal Vf representing a predetermined time interval. Since the observation depth is determined by the speed of sound and time of the ultrasonic wave, the clock signal Vf indirectly represents the observation depth.

On the basis of the clock signal Vf, a transmission/reception timing signal generator 202 generates a transmission/reception timing signal Vt functioning as a drive signal for driving the ultrasonic transducer 101 to generate an ultrasonic wave.

The ultrasonic transducer 101 in the catheter 110 pivots successively. The ultrasonic transducer 101 transmits/receives an ultrasonic wave on the basis of the transmission/reception timing signal Vt to obtain echo data at a predetermined position. An image formation (display on the CRT 108) is executed based on this echo data. When the ultrasonic transducer 101 rotates one revolution, a 360°-diagnosis image can be obtained.

A depth information generator 203 is reset by, e.g., the leading edge of the transmission/reception timing signal Vt, and generates depth information D representing the observation depth (depth gradually increases) in synchronism with the clock signal Vf. The observation depth is uniquely determined by the speed of sound and the period of the clock signal Vf. The pulse count (elapsed time) of the clock signal Vf represents the observation depth.

Figure 20:
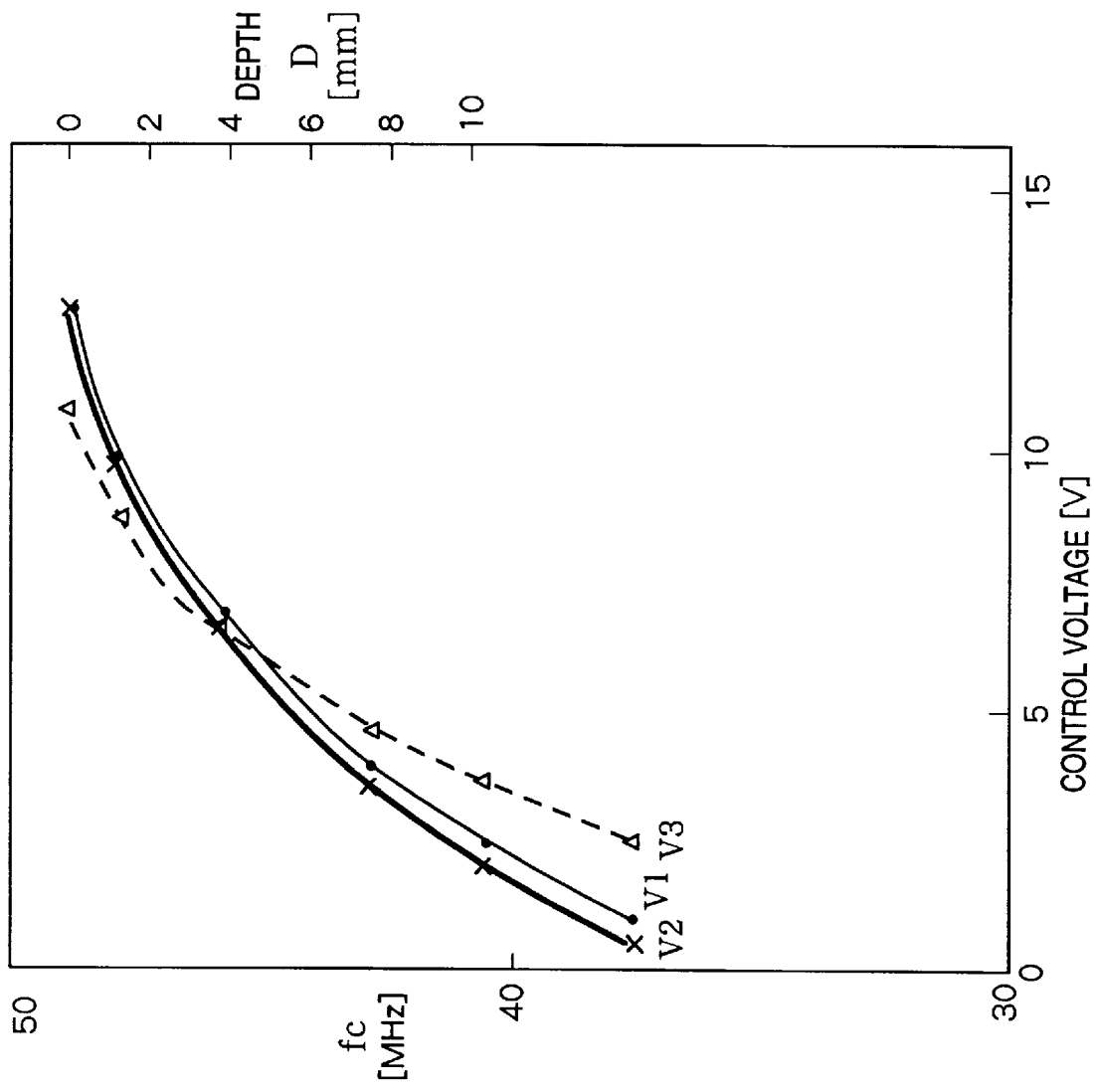
FIG. 20 is a graph showing the relationship between the cutoff frequency ($f_c$) of the high-frequency side (low-pass filter) in a variable frequency filter (bandpass filter), and control voltages V1 to V3, and the relationship between a depth D and the control voltages V1 to V3.
Figure 21:
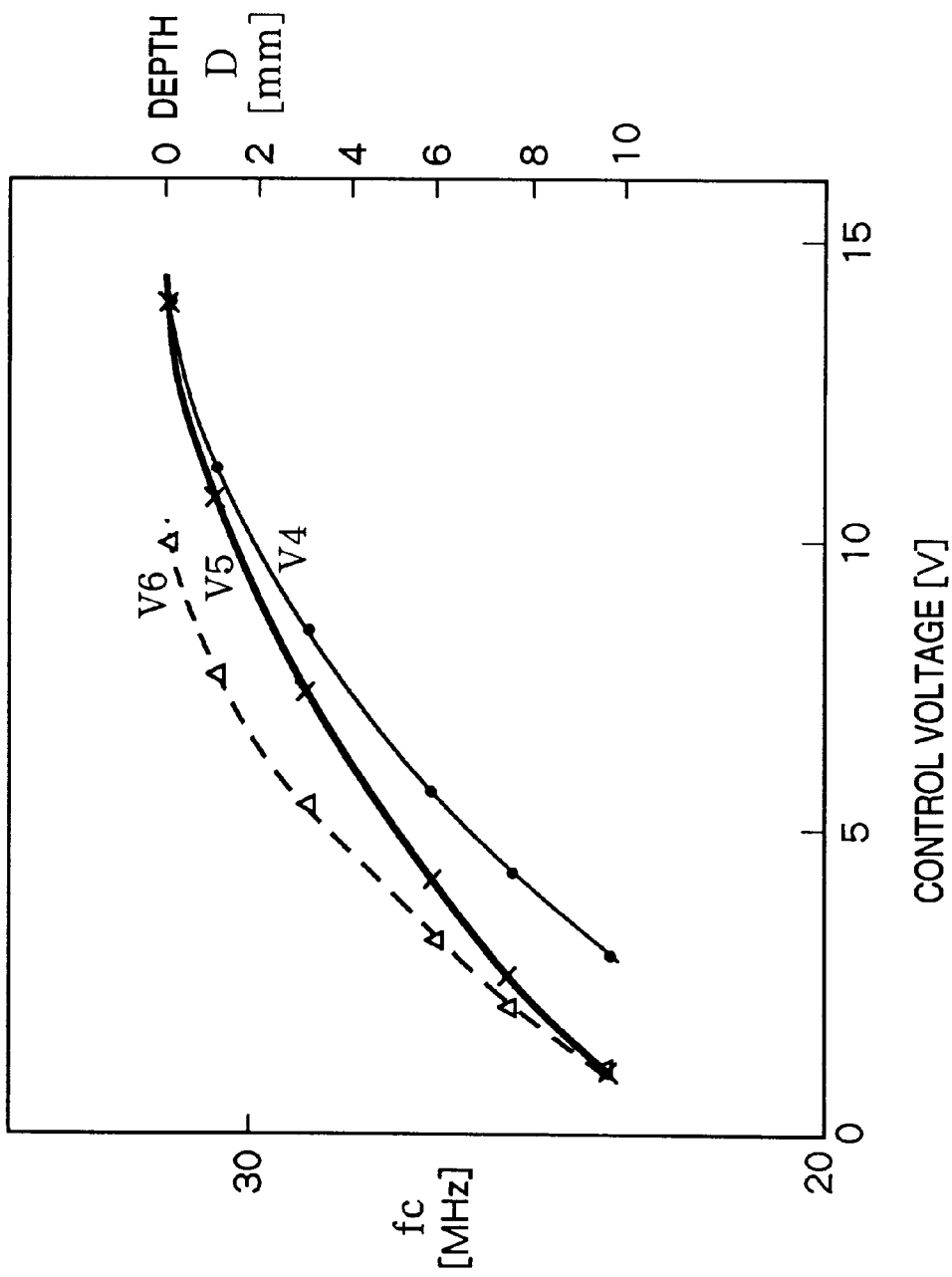
FIG. 21 is a graph showing the relationship between the cutoff frequency ($f_c$) of the low-frequency side (high-pass filter) in the variable frequency filter (bandpass filter), and control voltages V4 to V6, and the relationship between the depth D and the control voltages V4 to V6.

A ROM 204 holds a table 205 representing the relationship between the depth D and the voltages of the control signals V1 to V6, as shown in FIGS. 20 and 21. The ROM 204 outputs voltage information DV1 to DV6 (which are digital data buses corresponding to V1 to V6 in FIGS. 16 and 17) corresponding to the depth information D. Note that each of DV1 to DV6 is expressed in terms of plural bits. A D/A converter 206 D/A-converts the information DV1 to DV6 so as to control the control signals V1 to V6. With this arrangement, as the observation depth increases, the variable frequency filter 103 decreases the center frequency of the bandpass (in other words, decreases the cutoff frequencies of the low-pass and high-pass filters).

FIG. 20 is a graph showing the relationship between the cutoff frequency ($f_c$) of the high-frequency side (low-pass filter) in the variable frequency filter (bandpass filter), and the control voltages V1 to V3, and the relationship between the depth D and the control voltages V1 to V3.

FIG. 21 is a graph showing the relationship between the cutoff frequency ($f_c$) of the low-frequency side (high-pass filter) in the variable frequency filter (bandpass filter), and the control voltages V4 to V6, and the relationship between the depth D and the control voltages V4 to V6.

In FIGS. 20 and 21, the relationship between the control voltages V1 to V6 and the cutoff frequency ($f_c$) is determined by the circuit constant of the variable frequency filter and the characteristics of the variable capacitance diode. The relationship between the depth D and the cutoff frequency ($f_c$) is an example determined in consideration of the attenuation factor of the ultrasonic wave, the thermal noise, and the like.

<Another Example of Arrangement of Diagnostic Apparatus>

The above example of the arrangement of the diagnostic apparatus changes the characteristics of the variable frequency filter 103 (i.e., the cutoff frequencies of the low-pass and high-pass filters are decreased) in accordance with the elapsed time (observation depth) from a start of transmitting each ultrasonic beam. In other words, for all ultrasonic beams, the characteristics of the variable frequency filter 103 are uniformly changed in accordance with the elapsed time from the start of transmitting the ultrasonic beam regardless of the direction of the catheter.

Figure 17:
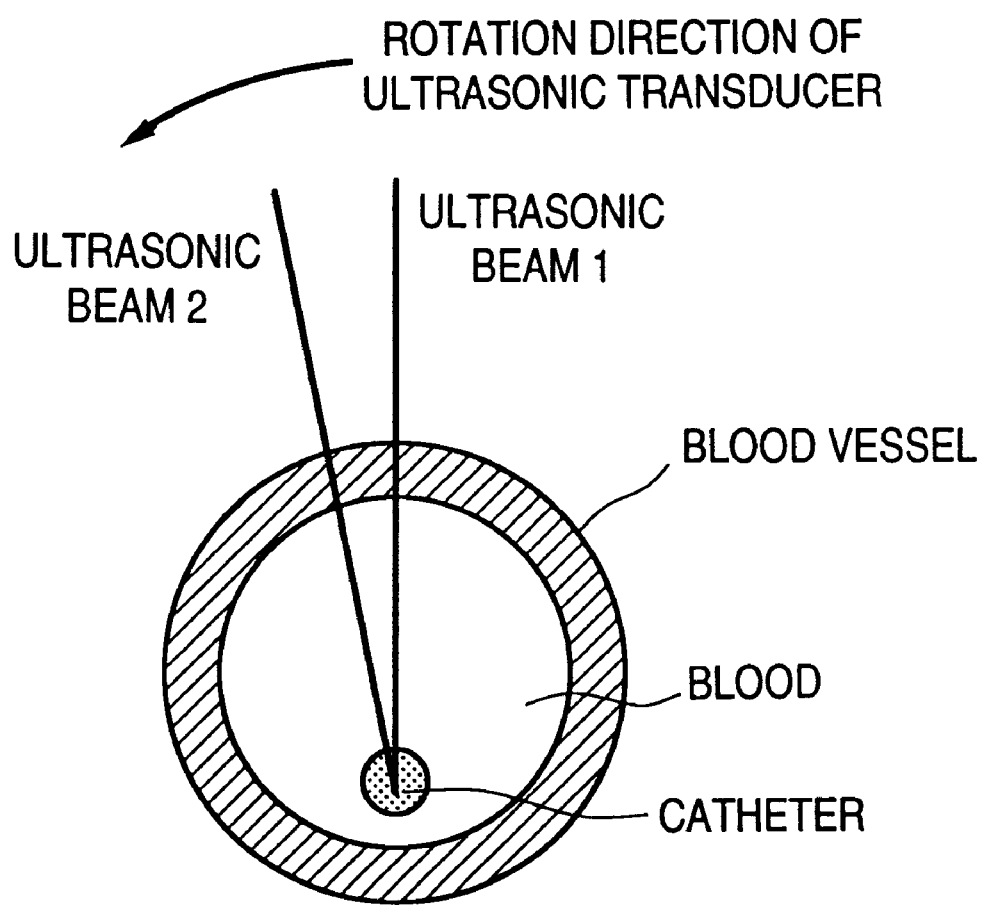
FIG. 17 is a view schematically showing a catheter in a blood vessel.

For example, when the catheter incorporating the ultrasonic transducer is inserted in a blood vessel, the catheter is seldom located at the center of the blood vessel, and normally offsets from the center, as shown in FIG. 17. Therefore, the distance from the catheter (ultrasonic transducer) to the blood vessel wall changes depending on the direction of the ultrasonic transducer (i.e., the direction of ultrasonic beam transmission). As a result, a high-resolution image can be obtained at a portion, of the blood vessel wall, near the catheter, while a relatively low-resolution image is obtained at a portion far from the catheter. These results particularly become noticeable in an aorta having a large blood vessel diameter (having a diameter larger than 30 mm at a thick portion). In addition to the case of the blood vessel, when physiological saline or the like is introduced into a body cavity to perform image-sensing with the catheter, these results become more noticeable as the body cavity is larger.

The attenuation factor of the ultrasonic wave by the blood, the physiological saline, or the like is greatly smaller than that by the tissue of the living body. Therefore, in a blood vessel, a vessel, or another body cavity where the catheter is inserted, a decrease in cutoff frequency of the variable frequency filter 103 in accordance with the observation depth leads to a decrease in resolution particularly when the blood vessel, the vessel, or the body cavity is large.

Considering the above, in this arrangement example, the cutoff frequency of the variable frequency filter 103 is not changed inside the blood vessel, the vessel, or another body cavity where the catheter 110 is located, while it is changed outside in accordance with the observation depth.

FIG. 17 is a schematic view showing the catheter in the blood vessel. Generally, the ultrasonic transducer in the catheter inserted in the blood vessel, the vessel, or another body cavity rotates counterclockwise when viewed from the distal end side of the catheter. In the example shown in FIG. 17, the ultrasonic transducer in the catheter successively pivots to obtain ultrasonic beams 1, 2, . . . at predetermined positions, thereby attaining a 360°-diagnosis image.

In this arrangement example, a wave reflected by the wall of a body cavity such as a blood vessel, a vessel, or a digestive tract is detected. This reflected wave is used as a trigger to decrease the cutoff frequency of the variable frequency filter 103 as the observation depth from the wall of the body cavity increases. Therefore, the wall of the body cavity can be represented as an image at a uniform resolution regardless of the direction of an ultrasonic beam from the ultrasonic transducer 101. The outside of the wall of the body cavity can also be similarly represented as an image at a uniform resolution regardless of the direction of ultrasonic beam from the ultrasonic transducer 101.

In this arrangement example, the reception signal Vrx is also supplied to the controller 107, as indicated by the arrow of a dotted line in FIG. 14.

Figure 18:
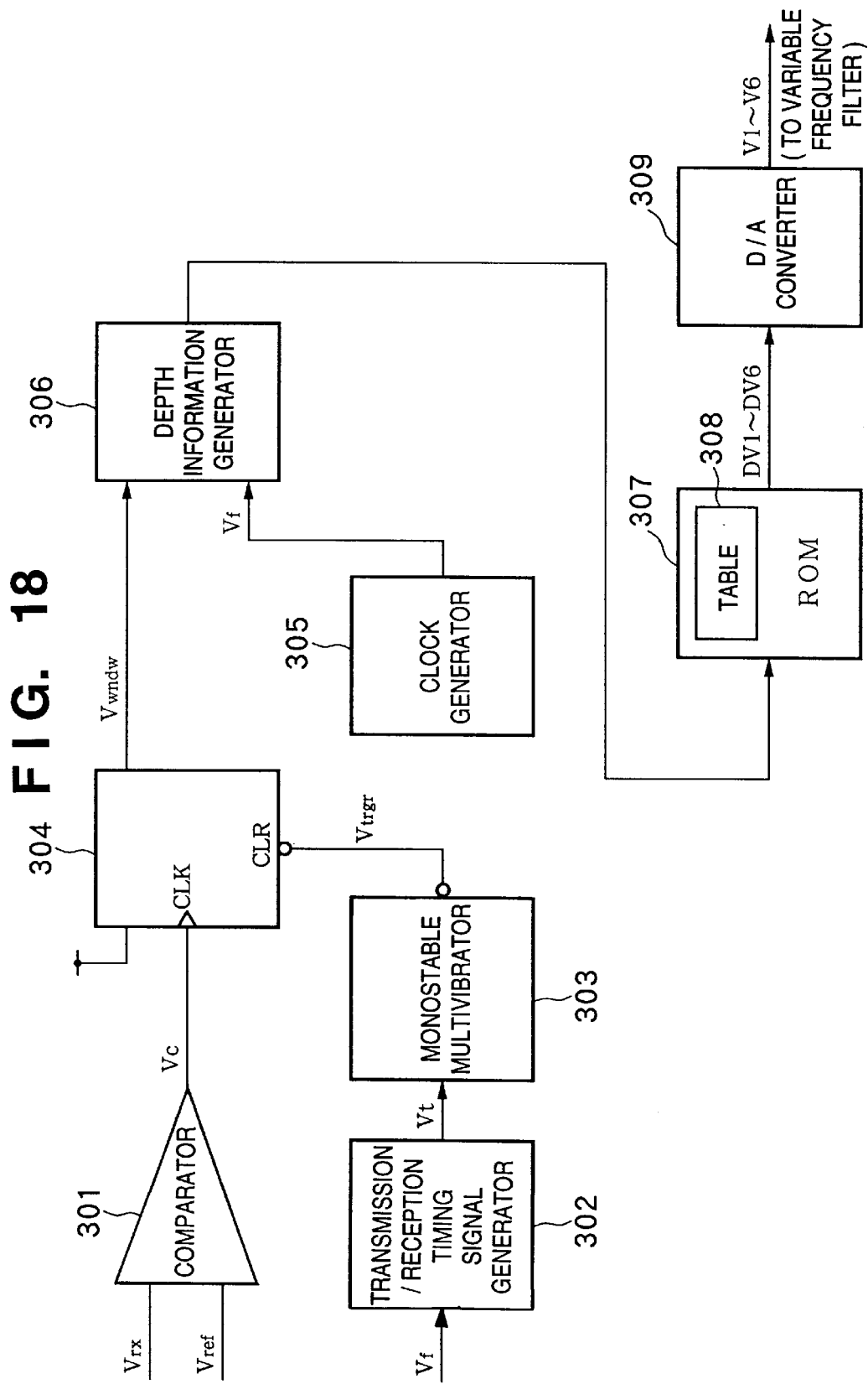
FIG. 18 is a block diagram showing another example of the arrangement of the controller.
Figure 19:
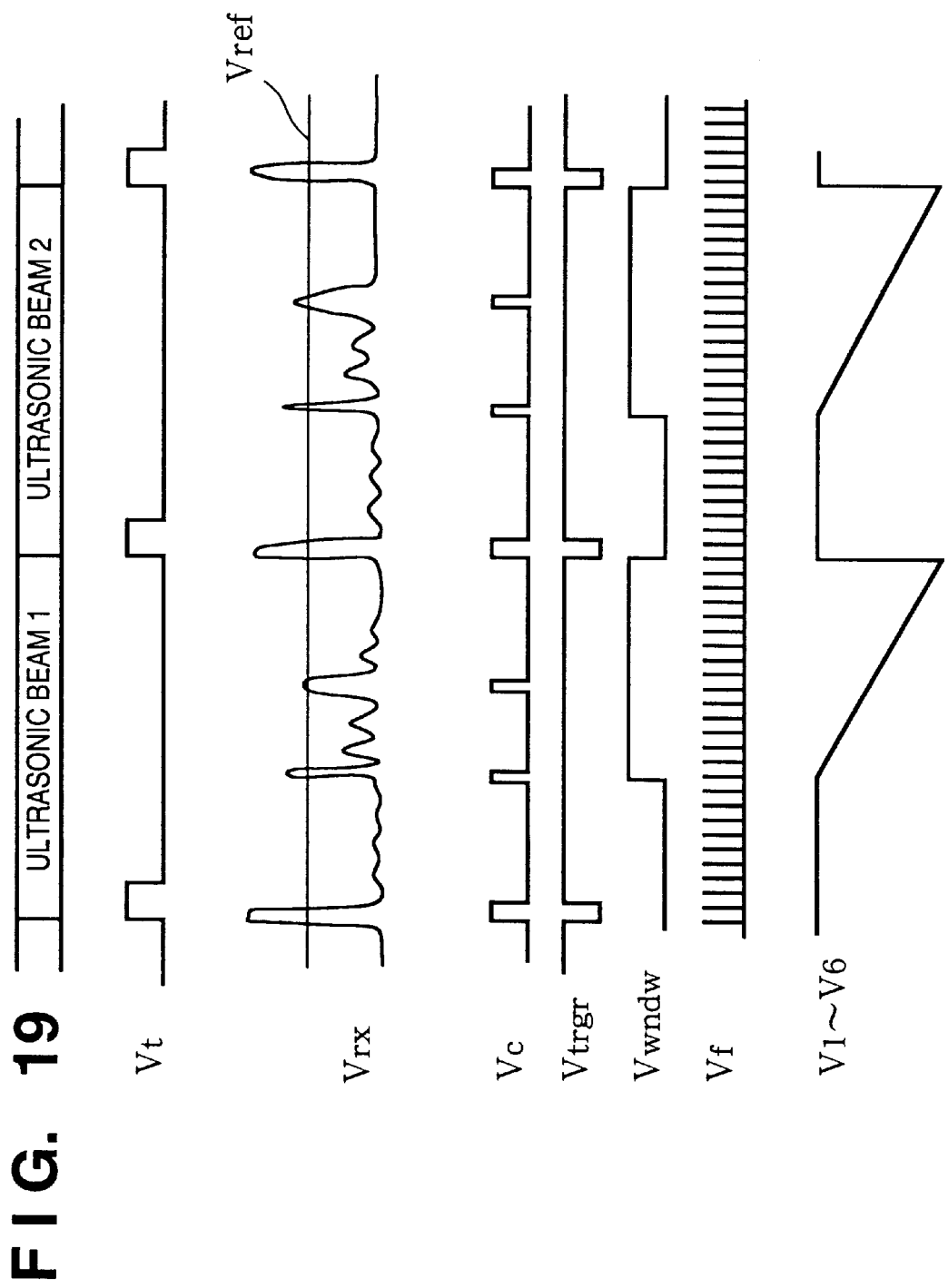
FIG. 19 is a waveform chart showing typical signal waveforms in the controller according to another example of the arrangement.

FIG. 18 is a block diagram showing an example of the arrangement of the controller 107. FIG. 19 is a waveform chart showing typical signal waveforms in the controller 107. A comparator 301 compares the reception signal Vrx supplied from the transmission/reception unit 102 with a predetermined threshold Vref, and detects a wave reflected by the wall of the body cavity where the catheter 110 is inserted, thereby outputting a detection signal Vc. Since there is only a reflected wave (very small signal) by a blood or physiological saline between a transmitted wave and a reflected wave by the wall of the body cavity where the catheter 110 is inserted, the level of the threshold Vref is adjusted so as to be able to detect the reflected wave by the wall of the body cavity subsequent to the transmitted wave. Note that an arrangement in which the level of the threshold Vref is properly adjusted by an operator may be employed.

On the basis of the clock signal Vf, a transmission/reception timing signal generator 302 generates a transmission/reception timing signal Vt functioning as a drive signal for driving the ultrasonic transducer 101 so as to generate an ultrasonic wave.

A monostable multivibrator 303 detects the leading edge of the transmission/reception timing Vt so as to output a high-level pulse signal Vtrgr having a predetermined width.

A flip-flop 304 outputs a high-level signal in synchronism with the leading edge of the output Vc from the comparator, and resets the output to a low level in synchronism with the trailing edge of the output signal Vtrgr from the monostable multivibrator 303. In other words, the flip-flop 304 outputs a window signal Vwndw which becomes active during a period between detection of the wave reflected by the wall of the body cavity where the catheter 110 is inserted, and transmission of the subsequent ultrasonic beam.

A clock generator 305 generates the clock signal Vf representing a predetermined time interval. A depth information generator 306 is reset by the trailing edge of the window signal Vwndw, and generates the depth information D (depth gradually increases) in synchronism with the clock signal Vf only when the window signal Vwndw is active (high level).

A ROM 307 holds a table 308 representing the relationship between the depth D and the control signals V1 to V6, as shown in FIGS. 16 and 17. The ROM 308 outputs the voltage information DV1 to DV6 (which are digital data buses corresponding to V1 to V6 in FIGS. 16 and 17) corresponding to the depth information D. Note that each of DV1 to DV6 is expressed in terms of plural bits. A D/A converter 309 D/A-converts the voltage information DV1 to DV6 so as to control the control signals V1 to V6. With this arrangement, the variable frequency filter 103 keeps the bandpass (cutoff frequency) constant inside the wall of the body cavity where the catheter 110 is inserted, while decreases the center frequency of the bandpass (i.e., decreases the cutoff frequencies of the low-pass and high-pass filters) as the observation depth from the wall of the body cavity increases.

According to this arrangement example, the wall of the body cavity where the catheter 110 is inserted can be uniformly represented as an image at a high resolution. The outside of the wall of the body cavity can also be represented as an image at a uniform resolution regardless of the direction of an ultrasonic beam from the ultrasonic transducer.

As many apparently widely different embodiments of the present invention can be made without departing from the spirit and scope thereof, it is to be understood that the invention is not limited to the specific embodiments thereof except as defined in the appended claims.

What is claimed is:

1. An ultrasonic apparatus for transmitting an ultrasonic wave to an object to assist in making a diagnosis for the object on the basis of a reflected wave from the transmitted wave, comprising:

transmission means for transmitting the ultrasonic wave to the object;

reception means for receiving the reflected wave by the object and converting the reflected wave into an electrical signal;

filter means for filtering the electrical signal; and control means for controlling a filter characteristic of said filter means, wherein said filter means includes at least two connected LC filters, each including a capacitor including a variable capacitance diode and an inductor, said control means adjusts a capacitance of at least one of the variable capacitance diodes in accordance with a depth to the object so as to control the filter characteristic of said filter means, a value of the capacitor including the variable capacitance diode is optimized around a lower limit and an upper limit within a variable range of a cutoff frequency of said filter means, a value of the inductor is opimizied around a median within the variable range, and a high-frequency side of the cutoff frequency is variable within a range of 20 MHZ or more.

2. The apparatus according to claim 1, wherein said control means decreases a cutoff frequency of a high-frequency side in said filter means as a depth to the observed object increases.

3. The apparatus according to claim 1, wherein said control means decreases a cutoff frequency of a high-frequency side in said filter means on the basis of an elapsed time from a start of transmitting the ultrasonic wave to the object.

4. The apparatus according to claim 1, wherein said filter means is a bandpass filter, and a flat characteristic of a passband in the bandpass filter falls within 0.1 dB.

5. The apparatus according to claim 1, further comprising imaging means for generating image information on the basis of the electrical signal filtered by said filter means.

6. An ultrasonic apparatus for transmitting an ultrasonic wave to an object to assist in making a diagnosis for the object on the basis of a reflected wave from the transmitted wave, comprising:

catheter incorporating transmitting means for generating an ultrasonic wave and transmitting the ultrasonic wave to the object;

reception means for receiving an ultrasonic wave reflected from the object and converting the reflected wave into an electrical signal;

filter means for filtering the electrical signal; and control means for controlling a filter characteristic of said filter means, wherein said control means keeps the filter characteristic almost constant on the reflected wave from inside of a body cavity where said catheter is inserted, while changing the filter characteristic on the reflected wave from outside of the body cavity in accordance with a depth to the observed object from a portion near a wall tissue of the body cavity.

7. The apparatus according to claim 6, wherein, as the observation depth from the portion near the wall tissue of the body cavity increases, said control means decreases a cutoff frequency of a high-frequency side in said filter means on the reflected wave from the outside of the body cavity where said catheter is inserted.

8. The apparatus according to claim 6, wherein, on the basis of reception of a reflected wave, exceeding a predetermined level, of waves reflected by the object, after the reception of the reflected wave, said control means decreases a cutoff frequency of a high-frequency side in said filter means as the observation depth from the tissue inside the object associated with the reflected wave increases.

9. The apparatus according to claim 6, wherein said control means decreases a cutoff frequency of a high-frequency side in said filter means in accordance with an elapsed time from reception of a reflected wave, exceeding a predetermined level, of waves reflected by the object.

10. The apparatus according to claim 6, wherein said filter means comprises an LC filter including a variable capacitance diode, and said control means adjusts a capacitance of the variable capacitance diode so as to change the filter characteristic.

11. The apparatus according to claim 6, wherein said filter means includes at least two connected LC filters, each including a variable capacitance diode, and said control means adjusts a capacitance of at least one of the variable capacitance diodes so as to change the filter characteristic.

12. The apparatus according to claim 11, wherein said filter means is a bandpass filter, a cutoff frequency of a high-frequency side in the bandpass filter is variable within a range of 20 MHZ or more, and a flat characteristic of a passband in the bandpass filter falls within 0.1 dB.

13. The apparatus according to claim 6, further comprising imaging means for generating image information on the basis of the electrical signal filtered by said filter means.

* * * * *